(12) United States Patent
Dutartre et al.

(10) Patent No.: US 8,158,495 B2
(45) Date of Patent: Apr. 17, 2012

(54) PROCESS FOR FORMING A SILICON-BASED SINGLE-CRYSTAL PORTION

(75) Inventors: Didier Dutartre, Meylan (FR); Laurent Rubaldo, Fontaine (FR); Alexandre Talbot, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 118 days.

(21) Appl. No.: 11/788,391

(22) Filed: Apr. 18, 2007

(65) Prior Publication Data

US 2007/0254451 A1    Nov. 1, 2007

(30) Foreign Application Priority Data

Apr. 19, 2006  (FR) ...................................... 06 03453

(51) Int. Cl.
*H01L 21/302* (2006.01)
(52) U.S. Cl. .. 438/478; 438/706; 438/405; 257/E21.131
(58) Field of Classification Search .................. 438/478, 438/405, 706–714, 719
See application file for complete search history.

(56) References Cited

U.S. PATENT DOCUMENTS

| | | | | |
|---|---|---|---|---|
| 4,371,421 A * | 2/1983 | Fan et al. | .......................... | 117/45 |
| 4,461,670 A * | 7/1984 | Celler et al. | ..................... | 117/54 |
| 4,498,951 A * | 2/1985 | Tamura et al. | ................... | 117/43 |
| 4,578,142 A * | 3/1986 | Corboy et al. | ................... | 117/89 |
| 4,952,526 A | 8/1990 | Pribat et al. | | |
| 7,186,630 B2 * | 3/2007 | Todd | ............................... | 438/478 |
| 7,364,976 B2 * | 4/2008 | Rachmady et al. | ........... | 438/300 |
| 7,468,311 B2 * | 12/2008 | Dip et al. | ....................... | 438/478 |
| 2002/0192930 A1 | 12/2002 | Rhee et al. | | |
| 2005/0079691 A1 | 4/2005 | Kim et al. | | |
| 2005/0179066 A1* | 8/2005 | Murthy et al. | ................. | 257/288 |
| 2006/0071213 A1 | 4/2006 | Ma et al. | | |
| 2006/0270129 A1* | 11/2006 | Paik | .............................. | 438/166 |
| 2007/0298594 A1* | 12/2007 | Mizushima et al. | ........... | 438/479 |

FOREIGN PATENT DOCUMENTS

WO   WO-2005/112577 A2   12/2005

OTHER PUBLICATIONS

C. Menon, et al., "Loading effect in SiGe layers grown by dichloroslane-and silane-based epitaxy," Journal of applied Physics, American Institute of Pysics, New York, US, Fol. n90, No. 9, Nov. 1, 2001, pps. 4805-4809' XP012054441; ISN: 0021-8979.

(Continued)

*Primary Examiner* — Savitr Mulpuri
(74) *Attorney, Agent, or Firm* — Gardere Wynne Sewell LLP

(57) ABSTRACT

Silicon-based single-crystal portions are produced on a surface of a substrate, selectively in zones where a single-crystal material is initially exposed. To do this, a layer is firstly formed over the entire surface of the substrate, using a silicon precursor of the non-chlorinated hydride type, and under suitable conditions so that the layer is a single-crystal layer in the zones of the substrate where a single-crystal material is initially exposed and amorphous outside these zones. The amorphous portions of the layer are then selectively etched so that only the single-crystal portions of the layer remain on the substrate.

25 Claims, 1 Drawing Sheet

OTHER PUBLICATIONS

Kim, et al., "Low temperature selective Si epitaxy by reduced pressure chemical vapor deposition instroducing periodic deposition and etching cycles with $SiH_4$, $H_2$ and HCl," Amorphous and Heterogeneous Silicon Thin Films-2000, San Francisco, CA, Apr. 24-28, 2000, Materials Research Society Symposium Proceedings, vol. 609 (MRS), Warrendale, PA, MRS, US, vol. 609, Apr. 24, 2000, pp. A8201-A8206; XO001134662; isbn: 1-55899-517-X.

Miyauchi, et al., "Low-Temperature (850° C) Silicon Selective Epitaxial Growth on HF-Treated SI (100) Substrates using SIH4-HCl-H2 Systems," Journal of the Electrochemical Society, Electrochemical Society, Manchester, New Hampshire, US, vol. 138, No. 11, Nov. 1, 1991, pps. 3480-3483; XP000248111; ISSN: 0013-4651.

Maruno, et al., "Selective Epitaxial Growth by Ultrahigh-Vacuum Chemical Vapor Deposition with Alternating Gas Supply of $Si_2H_6$ and $Cl_2$," Journal of Applied Physics, vol. 39 (2000), pp. 6139-6142, Part 1, No. 11, Nov. 2000, ® The Japan Society of Applied Physics.

Preliminary French Search Report, FR. 0603453, dated Feb. 15, 2007.

* cited by examiner

PROCESS FOR FORMING A SILICON-BASED SINGLE-CRYSTAL PORTION

PRIORITY CLAIM

The present application is a translation of and claims priority from French Patent Application No. 06 03453 of the same title filed Apr. 19, 2006, the disclosure of which is hereby incorporated by reference.

BACKGROUND OF THE INVENTION

1. Technical Field of the Invention

The present invention relates to a process for forming a silicon-based single-crystal portion on the surface of a substrate. In particular, the process may be carried out during the fabrication of an integrated electronic circuit.

2. Description of Related Art

Many integrated electronic circuit architectures require the production, on a substrate, of portions of a substantially single-crystal semiconductor material. Such portions may be used for example to form source and drain zones of MOS transistors that are raised, that is to say they are located above the surface of the substrate, or to produce heterojunction bipolar transistors.

It is known to produce substantially single-crystal portions starting from exposed parts of the substrate, which are themselves made of single-crystal material. The single-crystal parts of the substrate serve as seeds for forming the portions. Such a way of forming the portions is called epitaxial growth. Outside the single-crystal parts of the substrate, the surface of the substrate may consist of insulating material, such as silica ($SiO_2$) or silicon nitride ($Si_3N_4$). The material of the portions formed is in general silicon, or a silicon-germanium alloy, which may also include carbon atoms. The deposition process most often used for epitaxial growth is CVD (chemical vapor deposition). The layer is then formed from gaseous precursor compounds that are brought into contact with the surface of the substrate and chemically react thereon. Such a process is generally carried out in a vacuum chamber.

Substantially single-crystal portions are formed, using the compound dichlorosilane ($SiH_2Cl_2$) as a gaseous silicon precursor, in the substrate zones where the exposed surface is made of an initially single-crystal material. Simultaneously, amorphous, or possibly polycrystalline, portions are formed in the substrate zones where an insulating material is exposed, or even no portion is formed in the latter zones. In this case, the process for forming the single-crystal portion is called "selective epitaxial growth". Most often a gas mixture is used that comprises, apart from the dichlorosilane compound, hydrogen ($H_2$) molecules and germanium hydride ($GeH_4$) molecules. The deposition parameters comprise the partial pressures of the gaseous compounds, the temperature of the substrate and the amount of hydrogen chloride (HCl) that is added to the mixture. These parameters may be adjusted so as to obtain a defined degree of deposition selectivity between substrate zones where the surface is made of single-crystal material and substrate zones where the surface is made of insulating material.

However, such a process, which is based on the use of the compound dichlorosilane, has kinetic characteristics that vary very rapidly with the temperature of the substrate. More particularly, satisfactory deposition selectivity is achieved only for high substrate temperatures within a very narrow temperature range and within a narrow hydrogen chloride partial pressure range. As a result, the layers deposited have poor reproducibility characteristics, especially as regards their selectivity with respect to the material of the substrate that is exposed in different zones. Furthermore, the selectivity obtained depends on the dimensions of the various substrate zones. Finally, the single-crystal portions are formed under selective conditions, from a dichlorosilane/hydrogen chloride mixture, with a low growth rate. The deposition process must therefore be continued for a long time in order to obtain layers that have thicknesses compatible with the architecture of the integrated electronic circuit. Consequently, the deposition process limits the fabrication output that can be achieved on an integrated electronic circuit production line.

It is also known to use disilane ($Si_2H_6$) and gaseous chlorine ($Cl_2$) to selectively deposit a silicon-based substantially single-crystal material. In particular, the disilane and the chlorine may be brought into contact with the substrate alternately, and the selectivity of the layers deposited results from a latency time, after which deposition takes place in the substrate zones where an amorphous or insulating material is exposed. However, such a process is implemented only under ultra high-vacuum conditions and the alternation between introducing disilane and introducing chlorine requires very lengthy treatment times. Furthermore, this process is sensitive to the temperature of the substrate, which is roughly equivalent to the temperature at which the dichlorosilane is used. Said process therefore does not significantly improve the production yield for integrated electronic circuits, nor does it reduce the requirement to control the temperature of the substrate.

There is a need to provide a process for producing a silicon-based single-crystal portion, which process is selective with respect to the material of the substrate exposed in different zones and does not have the drawbacks indicated above.

SUMMARY OF THE INVENTION

To address the foregoing and other needs, a process is presented for forming at least one substantially single-crystal silicon-based portion on a surface of a substrate selectively in a first zone of the substrate, in which zone a substantially single-crystal silicon-based material forming part of the substrate is initially exposed, and not in a second zone of the substrate, in which a material other than said substantially single-crystal material forming part of the substrate is exposed. The process comprises:

/a/ heating the substrate and forming a silicon-based layer on the surface of the substrate, under suitable conditions so that said layer is selectively substantially single-crystal in the first substrate zone and amorphous in the second substrate zone, by bringing a first gas mixture comprising molecules of at least one non-chlorinated silicon hydride and molecules of a first carrier gas into contact with the substrate, at said surface in said first and second zones, the silicon hydride having a partial pressure between 0.03 and 30 torr and the molecules of the first carrier gas having a partial pressure between 10 and 760 torr; and /b/ etching selectively the silicon-based layer formed in step /a/ so that an amorphous portion of said layer formed in the second substrate zone is removed and a substantially single-crystal portion of said layer, formed in the first substrate zone, remains substantially intact.

Thus, the process is based on the use of a compound of the non-chlorinated hydride type as silicon precursor. By choosing such a compound, the temperature to which the substrate must be heated in order to form the silicon-based layer may be lower. As a result, the thermal budget undergone by already produced parts of an integrated electronic circuit comprising a single-crystal portion formed according to the invention is lower. In particular, there is less atomic diffusion between parts of the circuit consisting of different materials. Furthermore, thanks to the low thermal budget, the circuit may also contain portions of fragile, thermally metastable or unstable, materials without these being impaired during formation of the single-crystal portion.

Furthermore, the use of a compound of the non-chlorinated hydride type as a silicon precursor makes it possible for the layer of step /a/ to be formed more rapidly. In other words, the reaction system used has more rapid kinetics.

The process provides good selectivity of the single-crystal portion finally remaining on the substrate relative to the nature of the material present at the surface of the substrate in different zones. In step /a/, the layer is formed on the entire substrate, both in the substrate zones where the surface consists of single-crystal material and in substrate zones where the surface is made of a different material. In other words, the layer formed in step /a/ is continuous and covers the entire surface of the substrate. The layer portion that is formed in the zone where the surface is made of single-crystal material is obtained directly in single-crystal form, by epitaxial growth. A subsequent crystallization heat treatment is therefore unnecessary. A layer portion formed in step /a/ outside the zone where the surface of the substrate is made of a single-crystal material is amorphous. It is selectively removed in step /b/. Only the single-crystal portion exclusively located in the first substrate zone therefore remains on the substrate.

Single-crystal portions formed according to the process at different points on one and the same substrate have substantially identical thicknesses. Such thickness uniformity results from the stability of the process with respect to possible variations in physicochemical parameters within a substrate treatment chamber.

Furthermore, successive implementations of the process, with identical process control parameter values, exhibit good repeatability, given that the control parameters used are easily measured with sufficient precision.

The substantially single-crystal material forming part of the substrate that is initially exposed in the zone where the single-crystal portion is formed, called the first zone, may itself be based on optionally doped silicon or made of a silicon/germanium alloy that may furthermore include a certain amount of carbon. Outside this first zone, the substrate may comprise parts of an electrically insulating material exposed at its surface and/or parts of an amorphous material. Preferably, a silica ($SiO_2$) or silicon nitride ($Si_3N_4$) material is exposed on the surface of the substrate in the second substrate zone. In particular, deposition selectivity is obtained even when the area of exposure of the single-crystal material forming part of the substrate has small dimensions, and especially when it represents an area 8 to 10 times smaller than the area of exposure of the electrically insulating materials.

The non-chlorinated silicon hydride compound used in step /a/ may in particular be monosilane ($SiH_4$), disilane ($Si_2H_6$) or trisilane ($Si_3H_8$). Such compounds are commercially available and are inexpensive.

The molecules of the first carrier gas used in step /a/ may be hydrogen ($H_2$) or nitrogen ($N_2$) molecules.

Optionally, the first gas mixture may furthermore include at least one germanium or carbon compound. The layer formed in step /a/ therefore incorporates germanium or carbon atoms at least in the first substrate zone. In particular, germanium hydride ($GeH_4$) may be chosen as germanium compound and methylsilane ($SiH_3CH_3$) as carbon compound. For some applications of the single-crystal portion formed, the amount(s) of the germanium and/or carbon compound(s) that is (are) added to the gas mixture may be adjusted so as to obtain predetermined stresses in the portion. For example, prestressed MOS transistor channels may be produced in this way.

Likewise, the first gas mixture may also include a compound of an electrically doping element for silicon, in the case of the substantially single-crystal layer portion formed in the first substrate zone. As an example, hydrogen diboride ($B_2H_6$) may in particular be added to a gas mixture. The amount of compound/doping element in the first gas mixture may also be adjusted so that the layer incorporates the doping element in the first substrate zone with a predetermined concentration.

Step /b/ of selectively etching the silicon-based layer formed in step /a/ may be carried out by bringing this layer into contact with hydrogen chloride molecules in the first and second substrate zones. These hydrogen chloride molecules may be brought into contact with the layer within a second gas mixture that includes, apart from the hydrogen chloride molecules, molecules of a second carrier gas. The hydrogen chloride molecules and the molecules of the second carrier gas may have partial pressures between 5 and 760 torr and between 10 and 760 torr, respectively.

The molecules of the second carrier gas used in selective etching step /b/ may also comprise hydrogen molecules and/or nitrogen molecules.

Preferably, steps /a/ and /b/ are carried out in one and the same treatment chamber. In this way, the production time and the production installations needed to implement a process according to the invention are reduced.

In an embodiment, a process comprises: heating a single crystal silicon substrate to a first certain temperature in a treatment vacuum, a top surface of the substrate having first silicon zones and second isolation zones; flowing a first gas mixture over the single crystal silicon substrate in the treatment vacuum comprising molecules of at least one non-chlorinated silicon hydride and molecules of a carrier gas so as to form a material layer on a top surface of the substrate over both the first silicon zones and the second isolation zones, the material layer having a first crystalline structure over the first silicon zones and a second crystalline structure over the second isolation zones; and etching in the treatment vacuum with the substrate heated to a second certain temperature to selectively remove the second crystalline structure over the second isolation zones while substantially leaving the a first crystalline structure over the first silicon zones.

BRIEF DESCRIPTION OF THE DRAWINGS

Other specific features and advantages will become apparent in the following description of a non-limiting exemplary embodiment, which makes reference to the appended drawings, in which.

DETAILED DESCRIPTION OF THE DRAWINGS

Figure 1:
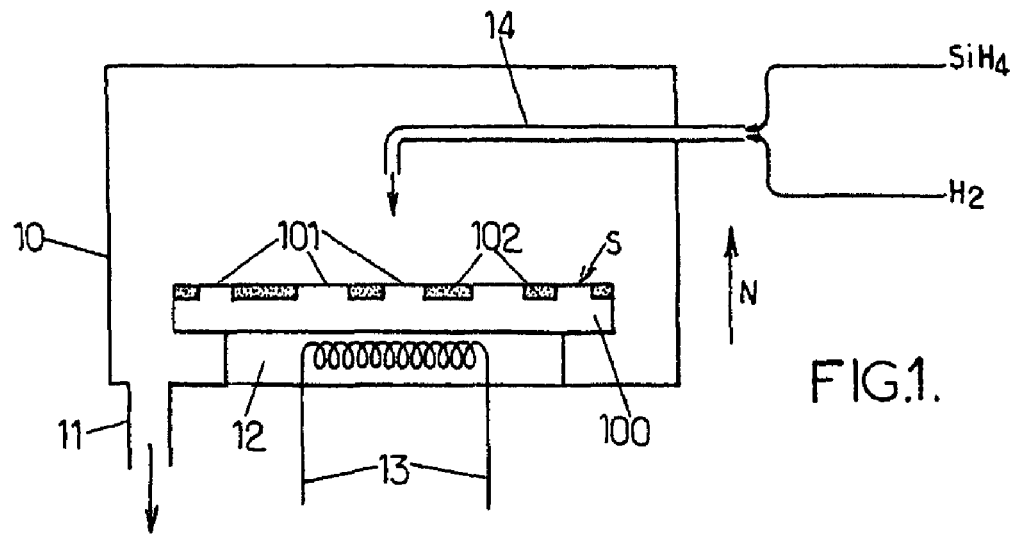
FIGS. 1 and 3 show schematically a device for treating a substrate suitable for implementing steps /a/ and /b/ of a process for forming at least one substantially single-crystal silicon-based portion on a surface of a substrate.

For the sake of clarity, the dimensions of the elements shown in these figures are not in proportion with actual dimensions or dimensional ratios. N is a direction perpendicular to a surface of an integrated electronic circuit substrate used to implement the invention. N is directed upwards in the figures. The words "on" and "beneath" used in the rest of the description refer to this orientation. Furthermore, identical references in two figures denote identical elements.

An integrated electronic circuit substrate, reference 100 in the figures, is made of single-crystal silicon. This may be a commercially available substrate, for example one for producing circuits in MOS (metal-oxide semiconductor) technology. It has a planar upper face denoted by S. Parts 102 of insulating material have been formed in the substrate 100, starting from the surface S, so as to define reduced areas 101 of the surface S in which the single-crystal silicon material of the substrate 100 is exposed. The parts 102 may for example be made of silica ($SiO_2$), especially when they are of the STI (shallow trench isolator) type. The zone 101 of the surface S may be intended for the production of active electronic components and are usually called "active zones".

According to FIG. 1, the substrate 100 is placed in a vacuum chamber 10 connected to a pumping unit (not shown) via an evacuation orifice 11. The pumping unit creates a vacuum inside the chamber 10, suitable for the treatments applied to the substrate 100. The substrate 100 is fixed to a support 12, which is provided with a heating system 13. A line 14 is used to introduce gases into the chamber 10 so that these gases come into contact with the surface S of the substrate 100.

A layer of silicon is firstly deposited on the surface S of the substrate 100. To do this, the substrate 100 is initially heated at a temperature between 500° C. and 650° C. A first gas mixture comprising monosilane ($SiH_4$) and a carrier gas, which may be hydrogen ($H_2$), is introduced into the chamber 10 via the line 14. Alternatively, nitrogen ($N_2$) may be used as carrier gas. The term "carrier gas" is understood to mean a dilution gas that does not participate directly in a chemical reaction inside the chamber 10 but does contribute to establishing a particular gas pressure during the substrate treatment. The respective monosilane and carrier gas flow rates may be determined so that these gases have respective partial pressures between, for example, 0.03 and 30 torr in the case of silane and between 10 and 760 torr in the case of the carrier gas. Such a deposition process is of the RTCVD (rapid thermal chemical vapor deposition) type.

Under these temperature and partial pressure conditions, a layer of silicon 1 (FIG. 2) is formed on the substrate 100 with a growth rate between 1 and 100 nm/min (nanometers per minute), considering the change in thickness of the layer 1 in the direction N. The deposition may be continued until the layer 1 has a thickness for example of 0.5 μm (0.5 microns) in the direction N.

Figure 2:
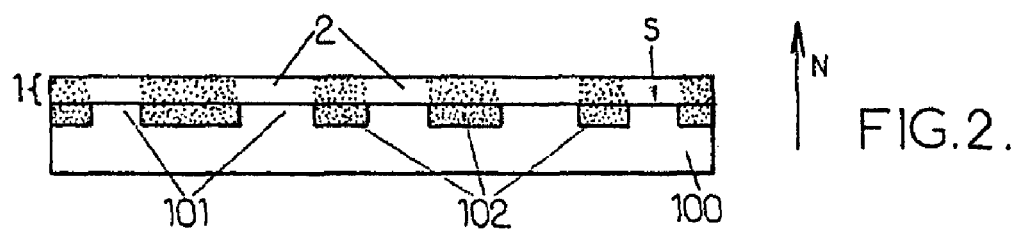
FIGS. 2 and 4 illustrate schematically an integrated electronic circuit substrate treated in accordance with that process, in states obtained after step /a/ and /b/, respectively.

The layer 1 is formed by epitaxial growth in the zone 101 of the surface S of the substrate 100. It grows progressively along the direction N and has a substantially single-crystal structure in these zones 101. The layer 1 is simultaneously formed on the substrate 100 outside these zones 101, that is to say on the insulating parts 102. However, the layer 1 on the parts 102 has an amorphous structure. In other words, the layer 1 is formed over the entire surface S of the substrate 100 with a crystalline structure that is determined by the material initially present at each point on the surface of the substrate 100. The layer 1 is a single-crystal layer at the points on the surface S where single-crystal silicon of the substrate is initially exposed, and is amorphous at the points on the surface S that correspond to the insulating parts 102. FIG. 2 illustrates schematically the structure of the layer 1 that is obtained after this deposition step.

Figure 3:
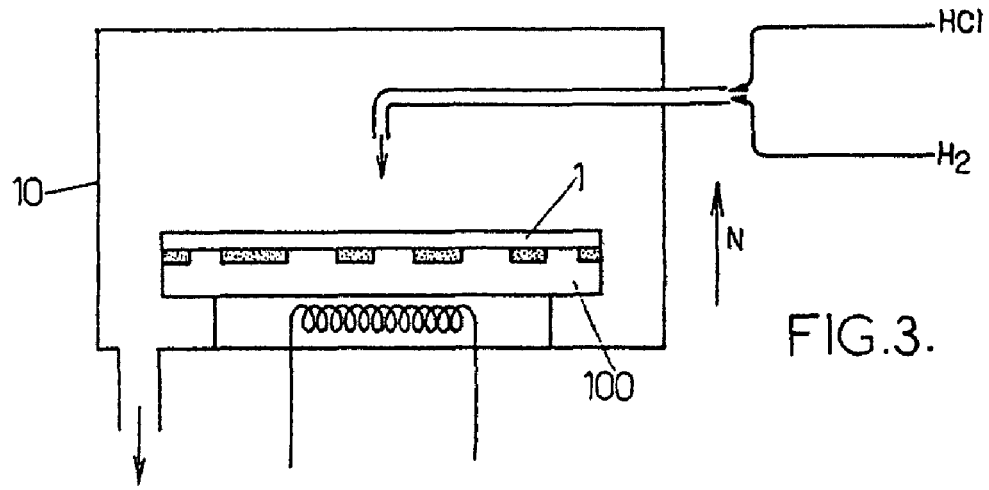
Figure 4:
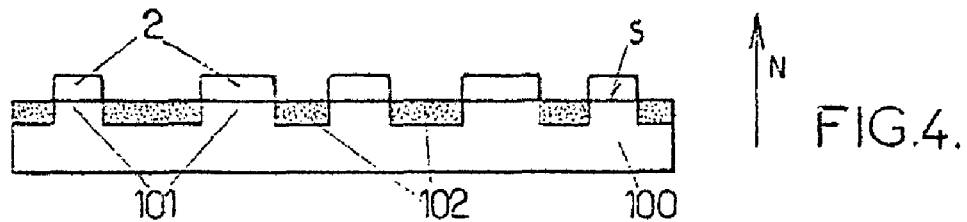

The layer 1 is then selectively etched. As shown in FIG. 3, a second gas mixture, comprising hydrogen chloride (HCl) and hydrogen ($H_2$), is introduced into the chamber 10 via the line 14 while the substrate 100 is heated at a temperature between 550° C. and 700° C. The hydrogen still has a carrier gas function, and may possibly be replaced with nitrogen. The hydrogen chloride and hydrogen partial pressures may be between 5 and 760 torr and between 10 and 760 torr, respectively. The layer 1 is then etched in the zones where it is amorphous, that is to say above the parts 102, at a rate that may be between 1 and 30 nm/min. In practice, single-crystal portions of the layer 1 are simultaneously etched at a rate ten times lower than the amorphous portions of this layer. Selective apparent etching of the layer 1 is thus obtained above the insulating parts 102. The etching is continued until the upper surface of the layers 102 has been exposed. The layer 1 is then composed only of residual single-crystal portions 2 located in the respective zones 101 of the surface S (FIG. 4).

In comparison with a process for forming the layer 1 which would produce single-crystal portions of this layer in the zones 101 and polycrystalline portions above the insulating parts 102, the process of the invention has the following advantages, due to the amorphous structure of the portions which are formed on the insulating portions 102:

- the selectivity of the etching step is improved: the inventors have obtained an improvement of this selectivity with a factor four for an identical selective etching process;
- the etching step can be performed at a temperature which is less high; and
- the morphology quality of the surface and the edges of the single-crystal portions 2 is better.

Optionally, the layer 1 deposited may be a silicon-germanium alloy. In this case, a germanium compound, which may be germanium hydride ($GeH_4$), is introduced into the chamber 10 with the silane, for example so as to obtain a partial pressure of the germanium compound between 2 and 600 mtorr (millitorr). When the substrate 100 is heated at a temperature between 400° C. and 600° C., for example 450° C., an alloy comprising about 20 at % germanium and 80 at % silicon is obtained for the layer 1. The temperature of the substrate 100 and the partial pressure of the germanium compound during deposition of the layer 1 may be adjusted so that the layer 1 has predetermined strains in the zone 101 of the substrate. Next, for the selective etching step, the temperature of the substrate 100 may be between 400° C. and 650° C., for example about 500° C., and the partial pressures of the hydrogen chloride and the carrier gas may be similar to those described above for etching a layer 1 of silicon containing no germanium.

Silicon portions 1 incorporating carbon atoms may also be obtained by introducing, for example, methylsilane ($SiH_3CH_3$) molecules simultaneously with the silane and the first carrier gas during deposition of the layer 1.

Finally, a precursor compound of an electrically doping element may be introduced into the chamber 10 via the line 14, simultaneously with the monosilane and the first carrier gas during deposition of the layer 1. When the doping element is boron, the compound hydrogen diboride ($B_2H_6$) may be used. When the doping element is phosphorus or arsenic, the compound phosphorus hydride ($PH_3$) or the compound arsenic hydride ($AsH_3$) may be used, respectively. The amount of the doping element compound introduced into the gas mixture may then be adjusted empirically, so as to obtain a defined boron, phosphorus or arsenic concentration in the layer 1, within the zone 101. High doping concentrations may thus be obtained. The single-crystal portions of layer 1 are therefore formed directly with a given value of electrical conductivity.

It should be understood that many adaptations may be introduced in the processes that have been described above. A person skilled in the art will understand that the numerical values mentioned are merely indicative and may be varied widely, while still retaining at least some of the advantages disclosed above. Furthermore, the substrate 100 used may be made of a silicon-germanium single-crystal alloy or it may include single-crystal parts made of a silicon-germanium-carbon ternary alloy, in the zones 101 lying between the insulating parts 102.

Finally, single-crystal portions according to the process may be used for many applications. For example, the production of prestressed MOS transistor channels, made of silicon-germanium alloy or of silicon incorporating carbon atoms, may be mentioned. Raised source and drain zones may also be obtained using the process, especially on substrates of the SOI-MOS type (where SOI stands for silicon on insulator), and in particular when the single-crystal silicon surface layer of these substrates is very thin.

It should also be understood that the process is not limited to the selective etching process that has been described in detail above, but that any other equivalent process, employing for example wet chemistry or a plasma, may also be used for step /b/.

Although preferred embodiments of the method and apparatus have been illustrated in the accompanying Drawings and described in the foregoing Detailed Description, it will be understood that such is not limited to the embodiments disclosed, but is capable of numerous rearrangements, modifications and substitutions without departing from the spirit of the invention as set forth and defined by the following claims.

What is claimed is:

1. A process for forming at least one substantially single-crystal silicon-based portion on a surface of a substrate, comprising:
   /a/ heating the substrate and forming a silicon-based layer on the surface of the substrate, under suitable conditions so that said silicon-based layer is selectively substantially single-crystal in a first substrate zone and amorphous in a second substrate zone, by bringing a first gas mixture comprising molecules of at least one non-chlorinated silicon hydride and molecules of a first carrier gas into contact with the substrate, at said surface in said first and second substrate zones, the molecules of silicon hydride having a partial pressure between 0.03 and 30 torr and the molecules of the first carrier gas having a partial pressure between 10 and 760 torr; and
   /b/ bringing a second gas mixture into contact with both the substantially single-crystal portion of the silicon-based layer and the amorphous portion of the silicon-based layer, the second gas mixture performing a dry gas chemical selective etch that selectively etches the silicon-based layer after formation in /a/ to completely remove the amorphous portion of said silicon-based layer formed in the second substrate zone while the substantially single-crystal portion of said silicon-based layer, formed in the first substrate zone, remains substantially intact;
   wherein the substrate is retained in a same treatment chamber during both /a/ heating the substrate and forming the silicon-based layer and /b/ performing the dry gas chemical selective etch that selectively etches said silicon-based layer; and
   wherein said dry gas chemical selective etch selectively etches the substantially single-crystal portion of said silicon-based layer at a rate at least equal to ten times lower than a rate for etching said amorphous portion of said silicon-based layer.

2. The process according to claim 1, in which a silica or silicon nitride material is exposed on the surface of the substrate in the second substrate zone.

3. The process according to claim 1, in which the non-chlorinated silicon hydride comprises one of monosilane, disilane or trisilane.

4. The process according to claim 1, in which the molecules of the first carrier gas comprise hydrogen molecules and/or nitrogen molecules.

5. The process according to claim 1, in which /a/ further comprises heating the substrate at a temperature between 500° C. and 650° C.

6. The process according to claim 1, in which the first gas mixture further includes at least one germanium compound or carbon compound and in which the layer incorporates germanium or carbon atoms at least in the first substrate zone.

7. The process according to claim 6, in which the quantity of germanium or carbon compound in the first gas mixture is adjusted so that the silicon-based layer possesses predetermined stresses in the first substrate zone.

8. The process according to claim 6, in which the first gas mixture comprises a germanium compound and in which the substrate is heated at a temperature between 400° C. and 600° C.

9. The process according to claim 6, in which the first gas mixture comprises a germanium compound having a partial pressure between 2 and 600 mtorr.

10. The process according to claim 1, in which the first gas mixture further includes a compound of an electrically doping element for silicon and in which the amount of said compound of the doping element in the first gas mixture is adjusted so that the silicon-based layer incorporates the doping element with a predetermined concentration in the first substrate zone.

11. The process according to claim 10, in which the substantially single-crystal portion of the silicon-based layer formed in the first substrate zone is part of a transistor.

12. The process according to claim 1, in which /b/ bringing a second gas mixture into contact with the silicon-based layer comprises bringing said silicon-based layer into contact with hydrogen chloride molecules in said first and second substrate zones.

13. The process according to claim 12, in which the second gas mixture comprises hydrogen chloride molecules and molecules of a second carrier gas, the hydrogen chloride molecules and the molecules of said second carrier gas having partial pressures between 5 and 760 torr and between 10 and 760 torr, respectively.

14. The process according to claim 13, in which the molecules of the second carrier gas comprise hydrogen molecules and/or nitrogen molecules.

15. The process according to claim 12, in which the silicon-based layer has a temperature between 550° C. and 700° C. during /b/ selectively etching said silicon-based layer.

16. The process according to claim 12, in which the first gas mixture comprises a germanium compound and in which the silicon-based layer has a temperature between 400° C. and 650° C. during the dry gas chemical selective etch.

17. The process according to claim 1, wherein /a/ forming the silicon-based layer produces a silicon-based layer having a thickness of at least 0.5 microns, and wherein /b/ bringing a second gas mixture to perform the dry gas chemical etch comprises selectively etching said at least 0.5 microns thick silicon-based layer.

18. A process, comprising:
heating a single crystal silicon substrate to a first certain temperature in a treatment chamber, a top surface of the substrate having first silicon zones and second isolation zones;
flowing a first gas mixture over the single crystal silicon substrate in the treatment chamber comprising molecules of at least one non-chlorinated silicon hydride and molecules of a carrier gas so as to form a material layer on a top surface of the substrate over both the first silicon zones and the second isolation zones, the material layer having a substantially single crystalline structure over the first silicon zones and an amorphous crystalline structure over the second isolation zones; and
following formation of the material layer, and without removing the substrate from the treatment chamber, flowing a second gas mixture over both the substantially single crystalline structure and the amorphous crystalline structure so to perform a dry chemical etch with the substrate heated to a second certain temperature to selectively and completely remove the amorphous crystalline structure over the second isolation zones while substantially leaving the substantially single crystalline structure present over the first silicon zones;
wherein said dry chemical etch has a selectivity for etching the substantially single crystalline structure at a rate at least equal to ten times lower than a rate for etching the amorphous crystalline structure.

19. The method of claim 18 wherein the first certain temperature is between 500° C. and 650° C. and the second certain temperature is between 550° C. and 700° C.

20. The method of claim 18 wherein the molecules of the silicon hydride have a partial pressure between 0.3 and 30 torr and the molecules of the carrier gas have a partial pressure between 10 and 760 torr, and wherein the second gas mixture comprises molecules of hydrogen chloride having a partial pressure between 5 and 760 torr.

21. The method of claim 18 wherein the first gas mixture further comprises a germanium compound so that the material layer is a silicon-germanium alloy.

22. The method of claim 18 wherein the first gas mixture further comprises a carbon compound so that the material layer includes carbon atoms.

23. The method of claim 18 wherein the first gas mixture further comprises a doping element so that the material layer, at least with the substantially single crystalline structure, is electrically conductive.

24. The method of claim 18 wherein the material layer formed by flowing has a thickness of at least 0.5 microns, and wherein the dry chemical etch is performed on the at least 0.5 microns thick material layer.

25. A process, comprising:
forming within a deposition chamber a silicon-based layer on a surface of a heated substrate by deposition under suitable conditions so that said layer includes a selectively substantially single-crystal portion in a first substrate zone and an amorphous portion in an adjacent second substrate zone;
wherein the silicon-based layer has a thickness of at least 0.5 microns; and
after formation of the at least 0.5 microns thick silicon-based layer, flowing within the same deposition chamber, and without removing the substrate from the deposition chamber, a gas mixture over both the substantially single crystalline portion and the amorphous crystalline portion so to perform a dry gas chemical etch which selectively etches the silicon-based layer so that the amorphous portion of said layer formed in the second substrate zone is completely removed and the substantially single-crystal portion of said layer formed in the first substrate zone remains substantially intact;
wherein forming the silicon-based layer comprises flowing a gas mixture over a single crystal silicon substrate comprising molecules of at least one non-chlorinated silicon hydride and molecules of a carrier gas, and wherein the gas mixture for the dry gas chemical etch comprises molecules of hydrogen chloride; and
wherein said dry gas chemical etch has a selectivity for etching the substantially single-crystal portion at a rate equal to or greater than ten times lower than a rate for etching the amorphous portion.

* * * * *

UNITED STATES PATENT AND TRADEMARK OFFICE
CERTIFICATE OF CORRECTION

| | | |
|---|---|---|
| PATENT NO. | : 8,158,495 B2 | Page 1 of 1 |
| APPLICATION NO. | : 11/788391 | |
| DATED | : April 17, 2012 | |
| INVENTOR(S) | : Didier Dutartre et al. | |

It is certified that error appears in the above-identified patent and that said Letters Patent is hereby corrected as shown below:

At column 7, line number 45, please replace [ton] with -- torr --.

Signed and Sealed this
Twenty-ninth Day of May, 2012

David J. Kappos
*Director of the United States Patent and Trademark Office*